(12) United States Patent
Sato (10) Patent No.: US 9,818,600 B2
(45) Date of Patent: Nov. 14, 2017

(54) SUBSTRATE PROCESSING APPARATUS AND METHOD OF MANUFACTURING SEMICONDUCTOR DEVICE

(71) Applicant: Hitachi Kokusai Electric Inc., Tokyo (JP)

(72) Inventor: Takayuki Sato, Toyama (JP)

(73) Assignee: Hitachi Kokusai Electric, Inc., Tokyo (JP)

(*) Notice: Subject to any disclaimer, the term of this patent is extended or adjusted under 35 U.S.C. 154(b) by 0 days.

(21) Appl. No.: 15/266,081

(22) Filed: Sep. 15, 2016

(65) Prior Publication Data

US 2017/0004966 A1 Jan. 5, 2017

Related U.S. Application Data

(63) Continuation of application No. PCT/JP2015/056976, filed on Mar. 10, 2015.

(30) Foreign Application Priority Data

Mar. 21, 2014 (JP) .................................. 2014-059307

(51) Int. Cl.
*H01L 21/02* (2006.01)
*H01J 37/32* (2006.01)

(52) U.S. Cl.
CPC .. *H01L 21/02164* (2013.01); *H01J 37/32064* (2013.01); *H01J 37/32091* (2013.01); *H01J 37/32183* (2013.01); *H01J 37/32568* (2013.01); *H01J 37/32743* (2013.01); *H01L 21/02274* (2013.01)

(58) Field of Classification Search
CPC ................................................ H01L 21/02164

USPC ......................................................... 438/788
See application file for complete search history.

(56) References Cited

U.S. PATENT DOCUMENTS

2004/0025791 A1* 2/2004 Chen ................. H01J 37/32706
118/728

FOREIGN PATENT DOCUMENTS

| JP | 07-086251 | 3/1995 |
| JP | 2009-231248 | 10/2009 |
| JP | 2013-055165 | 3/2013 |

* cited by examiner

*Primary Examiner* — Mark Armand
*Assistant Examiner* — Warren H Kilpatrick
(74) *Attorney, Agent, or Firm* — Edell, Shapiro & Finnan LLC (57) ABSTRACT

A substrate processing apparatus includes: a plasma generating unit to excite a process gas into plasma state; a process chamber where a substrate is processed using the process gas excited in plasma state; a loading port installed at a sidewall of the process chamber, wherein the substrate is passed through the loading port when the substrate is loaded into the process chamber; a substrate support supporting the substrate in the process chamber; an electrode unit installed in the substrate support and including a plurality of divided electrodes; an impedance adjusting unit electrically connected to each of the plurality of electrodes to adjust an impedance thereof; and a control unit to control the impedance of the impedance adjusting unit so as to adjust the electrical potentials of the respective electrodes of the electrode unit. The substrate processing apparatus improves the uniformity of a substrate during a substrate processing process using plasma.

10 Claims, 9 Drawing Sheets

SUBSTRATE PROCESSING APPARATUS AND METHOD OF MANUFACTURING SEMICONDUCTOR DEVICE

CROSS REFERENCE TO RELATED APPLICATIONS

This application is a continuation of International Application No. PCT/JP2015/056976, filed Mar. 10, 2015, which claims priority under 35 U.S.C. §119 to Japanese Patent Application No. 2014-059307, filed Mar. 21, 2014, the entire contents of which are hereby incorporated by reference.

FIELD OF THE INVENTION

The present disclosure relates to a technique for performing a substrate processing process of forming a film on a substrate such as a silicon wafer or etching or ashing the substrate, using plasma.

BACKGROUND

As one of processes for manufacturing a semiconductor device such as DRAM (dynamic random access memory), a substrate processing process is performed to form a film on a substrate using plasma. The substrate processing process is performed by a substrate processing apparatus which includes: a process chamber where a substrate is processed; a substrate support for supporting the substrate in the process chamber; a variable impedance electrode installed in the substrate support; an impedance adjusting unit connected to the variable impedance electrode and configured to adjust an impedance; a plasma generating unit configured to excite a process gas supplied to the process chamber; and a control unit for controlling at least the impedance adjusting unit.

When the substrate processing process is performed by the substrate processing apparatus, the process gas supplied into the process chamber is excited by the plasma generating unit, and active species of the excited process gas are supplied to the substrate so as to form a film on the substrate. At this time, as the impedance adjusting unit adjusts the impedance value of the variable impedance electrode, an amount of excited active species drawn toward the substrate is adjusted to control a film forming rate.

However, since power supplied by the plasma generating unit has a high frequency, an impedance of the variable impedance electrode for a certain impedance value adjusted by the impedance adjusting unit may be changed depending on the locations of the surface of the substrate. As a result, the electrical potential of the processed surface of the substrate may be changed depending on the locations on the surface of the substrate, the amount of excited active species drawn toward the substrate may be changed depending on the locations on the surface of the substrate, and the uniformity in amount of excited active species drawn toward the locations of the substrate may be changed at each process.

Furthermore, the uniformity of the film formed on the substrate may be changed even by a processing pressure. Thus, when a parameter such as the type of the process gas was changed, the processing pressure is changed to cope with the parameter change. However, the range which can be controlled only by the process pressure is so narrow that there is a limitation in acquiring a high film forming rate.

SUMMARY

Described herein is a technique for improving the uniformity of a film formed on a substrate while improving the reproducibility of uniform substrate processing.

According to one aspect described herein, a substrate processing apparatus includes: a plasma generating unit configured to excite a process gas into plasma state; a process chamber where a substrate is processed using the process gas excited in plasma state; a loading port installed at a sidewall of the process chamber, wherein the substrate is passed through the loading port when the substrate is loaded into the process chamber; a substrate support supporting the substrate in the process chamber; an electrode unit installed in the substrate support and including a plurality of divided electrodes; an impedance adjusting unit electrically connected to each of the plurality of electrodes and configured to adjust an impedance thereof; and a control unit configured to control the impedance of the impedance adjusting unit so as to adjust the electrical potentials of the respective electrodes of the electrode unit, wherein the control unit controls the impedance adjusting unit such that an impedance of an electrode positioned in a direction facing the loading port as viewed from the center of the electrode unit among the plurality of electrodes is higher than impedances of the other electrodes among the plurality of electrodes.

DETAILED DESCRIPTION

Hereinafter, embodiments will be described with reference to the accompanying drawings.

First, referring to FIGS. 1 and 2, a substrate processing apparatus according to a first embodiment will be described.

Figure 1:
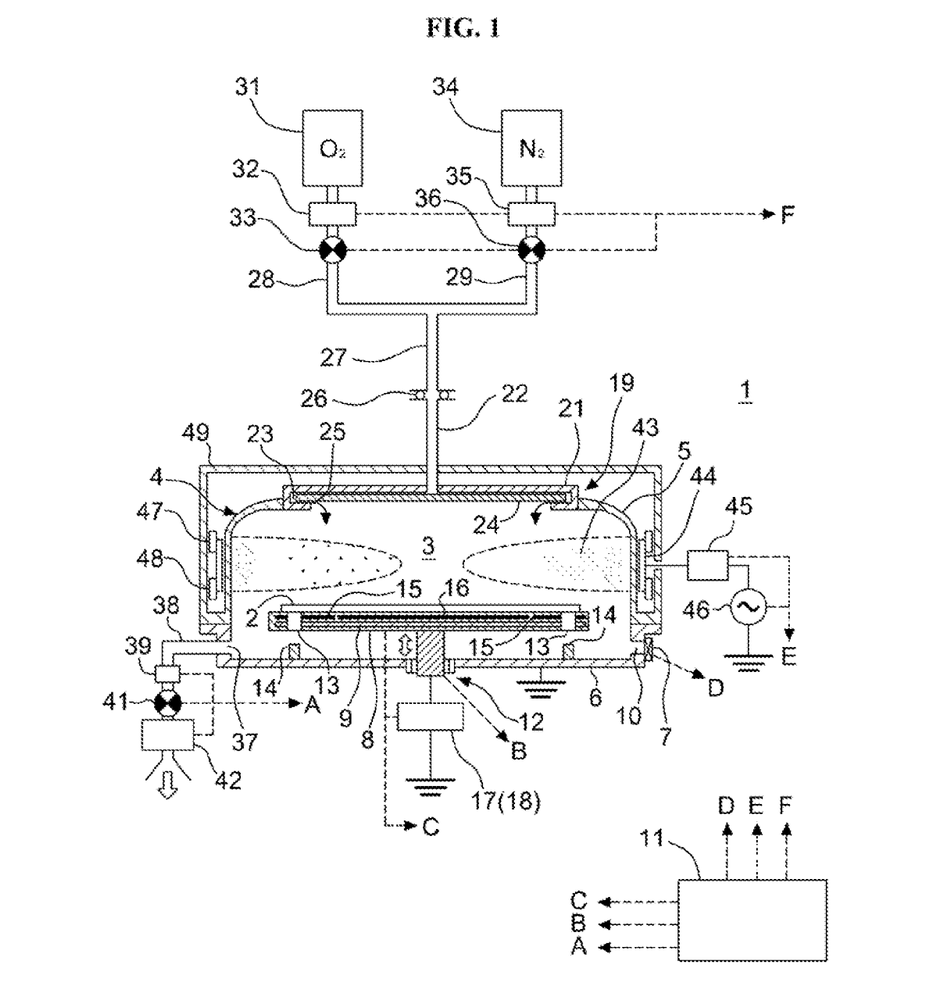
FIG. 1 is a schematic cross-sectional view of a substrate processing apparatus according to a first embodiment described herein.

FIG. 1 illustrates a substrate processing apparatus 1 which is an MMT apparatus. The substrate processing apparatus 1 plasma-processes a wafer 2 which is a substrate formed of a material such as silicon, using a modified magnetron-type plasma source capable of generating high-density plasma through an electric field and magnetic field. The substrate processing apparatus 1 may excite a process gas, oxidize or nitrify the surface of the wafer 2 or a film formed on the wafer 2, or perform a plasma treatment for forming a film on the wafer 2 or etching the surface of the wafer 2.

A process container 4 defining a process chamber includes a dome-shaped upper container 5 serving as a first container and a bowl-shaped lower container 6 serving as a second container. As the upper container 5 is disposed over the lower container 6, the process chamber 3 is formed. The upper container 5 is formed of a nonmetallic material such as aluminum oxide ($Al_2O_3$) or quartz ($SiO_2$), and the lower container 6 is formed of a metallic material such as aluminum (Al).

The lower container 6 has a gate valve 7 installed at a sidewall thereof. When the gate valve 7 is opened, a transfer mechanism (not illustrated) can load the wafer 2 into the process chamber 3 or unload the wafer 2 out of the process chamber 3 through a loading/unloading port 10. Furthermore, as the gate valve 7 is closed, the process chamber 3 may be airtightly sealed.

The process chamber 3 has a susceptor 8 disposed in the center of the bottom portion thereof, the susceptor 8 serving as a substrate support for supporting the wafer 2. The wafer 2 is placed on a substrate placing surface 8a of the susceptor 8. The susceptor 8 may be formed of a nonmetallic material such as aluminum nitride (AlN), ceramics or quartz, in order to reduce metal contamination of the wafer 2. The susceptor 8 is electrically insulated from the lower container 6.

The susceptor 8 has a heater 9 buried therein, the heater 9 serving as a heating device and disposed parallel to the substrate placing surface 8a. The wafer 2 may be heated by the heater 9. As power is supplied to the heater 9, the surface of the wafer 2 is heated to a predetermined temperature (for example, between room temperature and 1,000° C.). The susceptor 8 has a temperature sensor (not illustrated) installed therein, and the heater 9 and the temperature sensor are electrically connected to a controller 11 which will be described. The controller 11 is configured to control the power supplied to the heater 9 based on the temperature information detected by the temperature sensor.

Under the susceptor 8, a susceptor elevating mechanism 12 is installed to lift/lower the susceptor 8. The susceptor 8 has through-holes 13 formed therein, and at least three wafer lift pins 14 for supporting the wafer are installed on the bottom surface of the lower container 6. The through-holes 13 and the wafer lift pins 14 are arranged such that the wafer lift pins 14 are not in contact with the susceptor 8 when the susceptor 8 is lowered by the susceptor elevating mechanism 12.

Figure 2A:
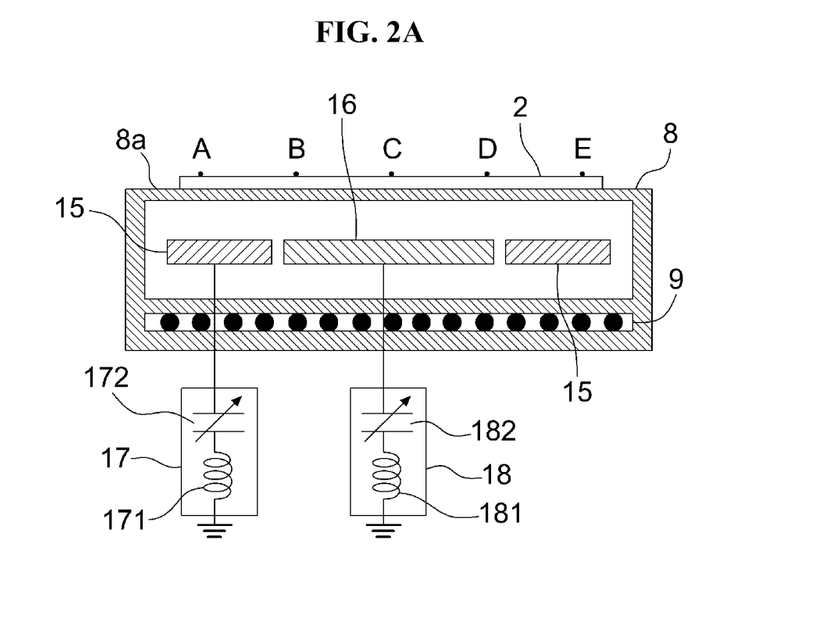
FIG. 2A is a schematic cross-sectional view of a substrate support installed in the substrate processing apparatus according to the first embodiment described herein.
Figure 2B:
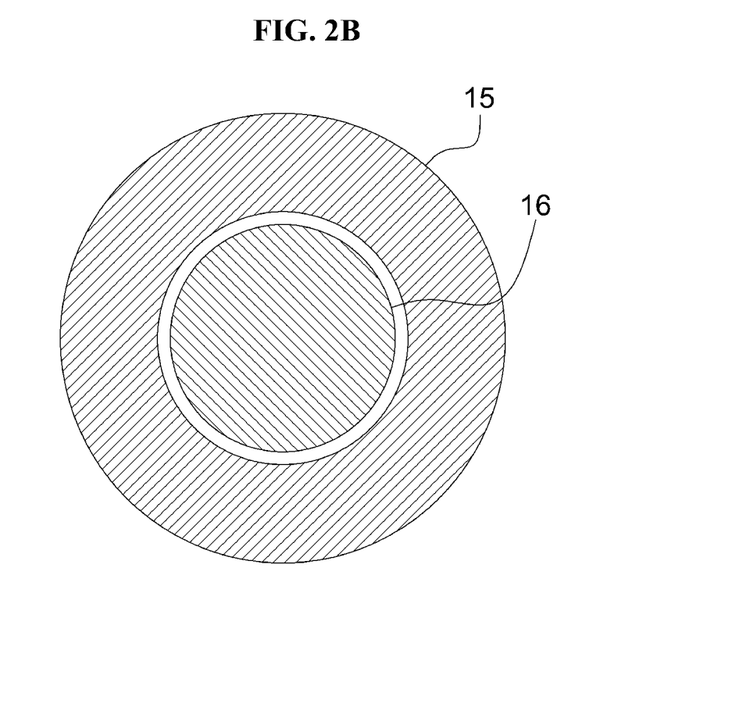
FIG. 2B is a schematic plan view of a variable impedance electrode.

As illustrated in FIG. 2, the susceptor 8 has a variable impedance electrode unit installed therein, the variable impedance electrode unit including two variable impedance electrodes for controlling the electrical potential of the wafer 2, or first and second variable impedance electrodes 15 and 16. The variable impedance electrodes 15 and 16 are disposed in parallel to the substrate placing surface 8a, and configured to uniformly adjust the electrical potential of the wafer 2.

The first variable impedance electrode 15 has an annular shape, and the second variable impedance electrode 16 has a discus shape. The second variable impedance electrode 16 is disposed in the first variable impedance electrode 15 so as to be concentric with the first variable impedance electrode 15. Although the first and second variable impedance electrodes 15 and 16 are installed so as not to be electrically contacted with each other, a distance between the first and second variable impedance electrodes 15 and 16 may be as short as possible.

The first variable impedance electrode 15 is connected to a first impedance adjusting unit 17 constituting a substrate potential distribution adjusting unit which is capable of changing an impedance value. The second variable impedance electrode 16 is connected to a second impedance adjusting unit 18 constituting the substrate potential distribution adjusting unit which is capable of changing an impedance value. The first and second impedance adjusting units 17 and 18 are grounded.

The first impedance adjusting unit 17 includes a coil 171 and a variable condenser 172 which are connected in series. The second impedance adjusting unit 18 includes a coil 181 and a variable condenser 182 which are connected in series.

The capacitance of the variable condenser 172 may be adjusted to change the impedance of the first impedance adjusting unit 17. The impedance of the first impedance adjusting unit 17 is changed to control the electrical potential of the first variable impedance electrode 15 with respect to plasma, e.g. the electrical potential of the peripheral portion of the processed surface of the wafer 2 immediately over the first variable impedance electrode 15. The peripheral portion of the processed surface of the wafer 2 indicates the periphery of the central portion of the processed surface of the wafer 2 of which the electrical potential is adjusted by the first impedance adjusting unit 17. The first impedance adjusting unit 17 is connected to the controller 11.

The capacitance of the variable condenser 182 may be adjusted to change the impedance of the second impedance adjusting unit 18. The impedance of the second impedance adjusting unit 18 is changed to control the electrical potential of the second variable impedance electrode 16 with respect to plasma, e.g. the electrical potential of the central portion of the processed surface of the wafer 2 immediately over the second variable impedance electrode 16. The second impedance adjusting unit 18 is connected to the controller 11.

The inventor of the present application has worked hard to find that the capacitances adjusted by the first and second impedance adjusting units 17 and 18 are proportional to the amount of drawn plasma. Specifically, as the capacitance is high, the amount of drawn plasma is increased. On the other hand, as the capacitance is low, the amount of drawn plasma is decreased.

The variable condensers 172 and 182 are controlled to adjust the amount of active species of plasma drawn toward the wafer 2 while controlling the film forming rate. As the film forming rate is controlled, the thickness of a formed film or the depth of a gas permeating into the film can be controlled.

As illustrated in FIG. 1, the process chamber 3 has a shower head 19 installed at the top thereof, the shower head 19 supplying a process gas into the process chamber 3. The shower head 19 includes a cap-shaped lid body 21, a gas introduction unit 22, a buffer chamber 23, a shielding plate 24 and a gas jetting port 25.

The lid body 21 is airtightly installed at an opening formed at the top of the upper container 5. The shielding plate 24 is installed under the lid body 21, and a space formed between the lid body 21 and the shielding plate 24 serves as the buffer chamber 23. The buffer chamber 23 functions as a dispersion space in which the process gas introduced from the gas introduction unit 22 is dispersed. The process gas passing through the buffer chamber 23 is supplied into the process chamber 3 from the gas jetting port 25 at a side of the shielding plate 24. The lid body 21 has an opening (not illustrated) formed therein, and the opening of the lid body 21 is airtightly connected to the downstream end of the gas introduction unit 22. The upstream end of the gas introduction unit 22 is connected to the downstream end of a gas supply pipe 27 with an O-ring 26 interposed therebetween, the O-ring 26 serving as a sealing member. Instead of the shielding plate 24, a shower plate having a plurality of gas passing holes may be employed to distribute and supply the process gas into the process chamber 3.

The downstream end of a process gas supply pipe 28 for supplying a process gas including an oxygen containing gas such as oxygen ($O_2$) gas and the downstream end of an inert gas supply pipe 29 for supplying an inert gas such as nitrogen ($N_2$) gas are connected to join the upstream side of the gas supply pipe 27. The gas supply pipe 27, the process gas supply pipe 28 and the inert gas supply pipe 29 are formed of a nonmetallic material such as quartz or aluminum oxide and a metallic material such as SUS.

The process gas supply pipe 28 is sequentially connected to a process gas supply source 31, a mass flow controller (MFC) 32 serving as a flow rate controller, and a valve 33 serving as an opening/closing valve, from the upstream side to the downstream side of the process gas supply pipe 28. The inert gas supply pipe 29 is sequentially connected to an inert gas supply source 34, an MFC 35 serving as a flow rate controller, and a valve 36 serving as an opening/closing valve, from the upstream side to the downstream side of the inert gas supply pipe 29. The $N_2$ gas which is an inert gas is used as a purge gas when a dilution gas of the process gas, a carrier gas of the process gas or a gas atmosphere is replaced.

The MFC 32 and the valve 33 are electrically connected to the controller 11. The controller 11 is configured to control the opening degree of the MFC 32 and the opening/closing of the valve 33 such that the flow rate of the process gas supplied into the process chamber 3 becomes a predetermined flow rate. As the valve 33 is opened/closed and the flow rate is controlled through the MFC 32, a desired amount of $O_2$ gas serving as the process gas may be supplied into the process chamber 3 through the gas supply pipe 27, the buffer chamber 23 and the gas jetting port 25.

The MFC 35 and the valve 36 are electrically connected to the controller 11. The controller 11 is configured to control the opening degree of the MFC 35 and the opening/closing of the valve 36 such that the flow rate of the inert gas mixed with the process gas or the inert gas supplied into the process chamber 3 becomes a predetermined flow rate. The valve 36 and the MFC 35 are controlled to mix a predetermined flow rate of gas with the process gas. The valve 36 and the MFC 35 may be controlled to supply a desired amount of N2 gas as the inert gas into the process chamber 3 through the gas supply pipe 27, the buffer chamber 23 and the gas jetting port 25.

The gas supply unit (gas supply system) according to the first embodiment is constituted by the shower head 19, the gas supply pipe 27, the process gas supply pipe 28, the inert gas supply pipe 29, the MFCs 32 and 35 and the valves 33 and 36. The gas supply unit may further include the process gas supply source 31 and the inert gas supply source 34.

The lower container 6 has a gas exhaust port 37 installed at the bottom of a sidewall thereof, in order to discharge the process gas or the like from the process chamber 3. The gas exhaust port 37 is connected to the upstream end of a gas exhaust pipe 38 for discharging a gas. The gas exhaust pipe 38 includes an APC 39, a valve 41 and a vacuum pump 42 which are sequentially installed from the upstream side to the downstream side. The APC 39 serves as a pressure controller, the valve 41 serves as an opening/closing valve, and the vacuum pump 42 serves as an exhauster. The exhaust unit (exhaust system) according to the first embodiment is constituted by the gas exhaust port 37, the gas exhaust pipe 38, the APC 39 and the valve 41. The exhaust unit may further include the vacuum pump 42.

The APC 39, the valve 41 and the vacuum pump 42 may be electrically connected to the controller 11. As the vacuum pump 42 is operated and the valve 41 is opened, the process chamber 3 may be exhausted. The opening degree of the APC 39 may be adjusted to control the internal pressure of the process chamber 3.

The process container 4 (upper container 5) has a cylindrical electrode 44 installed on the outer circumference thereof so as to surround a plasma generation area 43 within the process chamber 3. The cylindrical electrode 44 is connected to a high-frequency power supply 46 through a matcher 45 for performing impedance matching, the high-frequency power supply 46 serving to generate high-frequency power. The cylindrical electrode 44 functions as a discharge device for exciting the process gas supplied into the process chamber 3.

The cylindrical electrode 44 has an upper magnet 47 and a lower magnet 48 which are installed on the upper and lower ends of the outer surface thereof, respectively. Each of the upper and lower magnets 47 and 48 include a cylindrical or ring-shaped permanent magnet. Each of the upper and lower magnets 47 and 48 has magnetic poles on two ends thereof in the radial direction of the process chamber 3, e.g. the inner and outer circumferential surfaces of the magnet. The upper and lower magnets 47 and 48 are arranged such that the magnetic poles of the upper magnet 47 are set in the opposite direction of the magnetic poles of the lower magnet 48. That is, the magnetic poles of the inner circumferential surfaces of the upper and lower magnets 47 and 48 are different from each other. Thus, magnetic field lines are formed along the inner surface of the cylindrical electrode 44.

After $O_2$ gas is supplied into the process chamber 3, magnetron discharge plasma is generated in the plasma generation area 43 of the process chamber 3 by the magnetic fields of the upper and lower magnets 47 and 48, along with forming an electric field by applying high-frequency power to the cylindrical electrode 44. At this time, the electric field and the magnetic field subject the released electron to orbital motion. The orbital motion raises the ionization generation rate of plasma, thereby generating high-density plasma.

The plasma generating unit according to the first embodiment is constituted by the cylindrical electrode 44, the matcher 45, the high-frequency power supply 46, the upper magnet 47 and the lower magnet 48.

Around the cylindrical electrode 44, the upper magnet 47 and the lower magnet 48, a metallic shielding plate 49 is installed to efficiently block electric and magnetic fields from having adverse effects on the external environment or a device such as another processing furnace, the electric and magnetic fields being formed by the cylindrical electrode 44, the upper magnet 47 and the lower magnet 48.

The controller 11 serving as a control unit is configured to control the operations of the APC 39, the valve 41 and the vacuum pump 42 through a signal line A, control the operation of the susceptor elevating mechanism 12 through a signal line B, control the amount of power supplied to the heater 9 or the impedance values of the first and second impedance adjusting units 17 and 18 through a signal line C, control the operation of the gate valve 7 through a signal line D, control the operations of the matcher 45 and the high-frequency power supply 46 through a signal line E, and control the operations of the MFCs 32 and 35 and the valves 33 and 36 through a signal line F.

Figure 3:
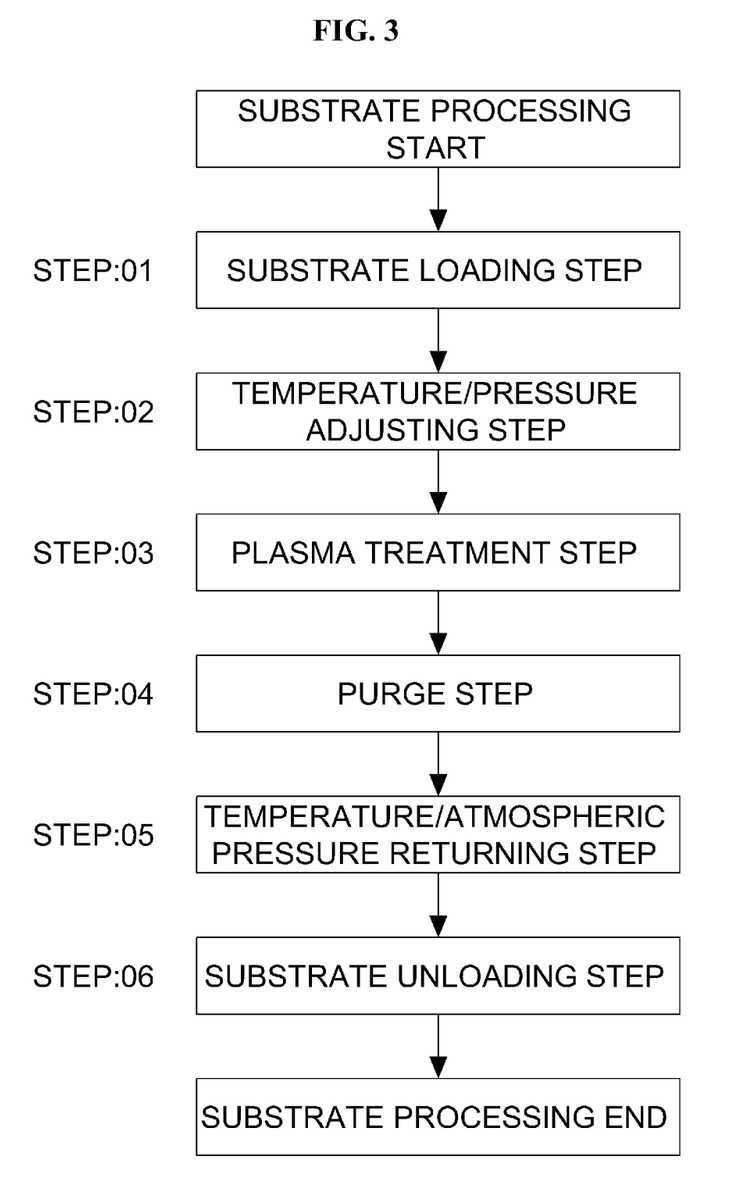
FIG. 3 is a flowchart illustrating a method of manufacturing a semiconductor device according to the first embodiment described herein.

The substrate processing process which is a semiconductor manufacturing process according to the first embodiment will be described with reference to a flowchart of FIG. 3. The substrate processing process is performed by the substrate processing apparatus 1. The substrate processing process according to the first embodiment is to oxidize the surface of the wafer 2 formed of silicon (Si), for example, using plasma. In the following descriptions, the controller 11 controls the operations of the respective components included in the substrate processing apparatus 1.

STEP: 01 (Substrate Loading Step)

First, the susceptor 8 is lowered to a transfer position of the wafer 2, and the wafer lift pins 14 are passed through the through-holes 13 of the susceptor 8 so as to protrude from the surface of the susceptor 8. Then, the gate valve 7 is opened, and the wafer 2 is loaded into the process chamber 3 by the transfer mechanism (not illustrated). As a result, the wafer 2 is horizontally supported on the wafer lift pins 14 protruding from the surface of the susceptor 8. The wafer 2 may have a predetermined shape of uneven structure formed on the processed surface thereof, the uneven structure including a MOS transistor gate structure or a capacitor structure of DRAM which is formed in advance.

When the wafer 2 is loaded into the process chamber 3, the transfer mechanism is retreated to the outside of the process chamber 3, and the gate valve 7 is closed to seal the process chamber 3. Then, as the susceptor elevating mechanism 12 lifts the susceptor 8, the wafer 2 is placed on the top surface of the susceptor 8. Then, the susceptor elevating mechanism 12 lifts the susceptor 8 to a predetermined position such that the wafer 2 is lifted to a predetermined process position.

When the wafer 2 is loaded into the process chamber 3, $N_2$ gas serving as a purge gas may be supplied into the process chamber 3 from the gas supply unit while the process chamber 3 is exhausted by the exhaust unit. That is, the vacuum pump 42 may be operated and the valve 41 may be opened in order to exhaust the process chamber 3. Simultaneously, the valve 36 may be opened to supply $N_2$ gas into the process chamber 3 through the buffer chamber 23. Thus, it is possible to suppress particles from permeating into the process chamber 3 or adhering to the surface of the wafer 2. The vacuum pump 42 is continuously operated until a substrate unloading step (STEP: 06) is ended after the substrate loading step (STEP: 01) is started.

STEP: 02 (Temperature and Pressure Adjusting Step)

Then, power is supplied to the heater 9 buried in the susceptor 8 in order to heat the surface of the wafer 2 to a predetermined temperature which ranges from 200° C. to 750° C. or desirably ranges from 350° C. to 550° C. At this time, the temperature of the heater 9 is adjusted by controlling the power supplied to the heater 9 based on temperature information detected by the temperature sensor (not illustrated).

When the surface of the wafer 2 is heated to a temperature of not less than 750° C., diffusion of impurities may occur in a source region or drain region formed at the surface of the wafer 2, and the circuit characteristic may be degraded to reduce the performance of the semiconductor device. As the temperature of the wafer 2 is limited as described above, it is possible to suppress the diffusion of impurities in the source region or drain region formed at the surface of the wafer 2, the degradation of the circuit characteristic, and the reduction in performance of the semiconductor device.

Until the internal pressure of the process chamber 3 reaches a desired pressure which ranges from 0.1 Pa to 300 Pa or desirably ranges from 20 Pa to 40 Pa, the process chamber 3 is vacuum-exhausted by the vacuum pump 42. At this time, the internal pressure of the process chamber 3 is measured by a pressure sensor (not illustrated), and the opening degree of the APC 39 is feedback-controlled based on the pressure measured by the pressure sensor.

STEP: 03 (Plasma Treatment Step)

Hereafter, an example in which $O_2$ gas is used as a process gas will be described. First, the valve 33 is opened to supply $O_2$ gas as the process gas into the process chamber 3 through the buffer chamber 23 from the process gas supply pipe 28. At this time, the opening degree of the MFC 32 is adjusted to set the flow rate of $O_2$ gas to a predetermined flow rate.

When $O_2$ gas is supplied as the process gas into the process chamber 3, $N_2$ gas functioning as a carrier gas or dilution gas may also be supplied into the process chamber 3 from the inert gas supply pipe 29. That is, the valve 36 may be opened to supply $N_2$ gas into the process chamber 3 through the buffer chamber 23 while the flow rate of $N_2$ gas is adjusted through the MFC 35. Then, the supply of $O_2$ gas into the process chamber 3 may be promoted.

After the supply of the process gas is started, predetermined high-frequency power is applied to the cylindrical electrode 44 through the matcher 45 from the high-frequency power supply 46, with the magnetic field being formed by the upper and lower magnets 47 and 48. The predetermined high-frequency power may range from 100 W to 1,000 W or desirably range from 100 W to 500 W. As a result, magnetron discharge occurs in the process chamber 3, and high-density plasma is generated in the plasma generation area 43 above the wafer 2. As the plasma is generated, the $O_2$ gas supplied into the process chamber 3 is excited and activated. Then, active species such as active oxygen or oxygen radicals contained in the excited $O_2$ gas are supplied to the wafer 2 such that oxidation is performed.

At this time, the impedance of the first impedance adjusting unit 17 is adjusted by controlling the variable condenser 172 to adjust the capacitance of the first impedance adjusting unit 17. Furthermore, the impedance of the second impedance adjusting unit 18 is adjusted by controlling the variable condenser 182 to adjust the capacitance of the second impedance adjusting unit 18. As such, the impedances of the first and second impedance adjusting units 17 and 18 are adjusted.

As the impedances are adjusted according to the capacitances of the variable condensers 172 and 182 connected to the first and second variable impedance electrodes 15 and 16, respectively, the electrical potential of the processed surface of the wafer 2 may be adjusted, and the amount of active species introduced into the regions of the wafer 2 corresponding to the first and second variable impedance electrodes 15 and 16 may be controlled.

Figure 4:
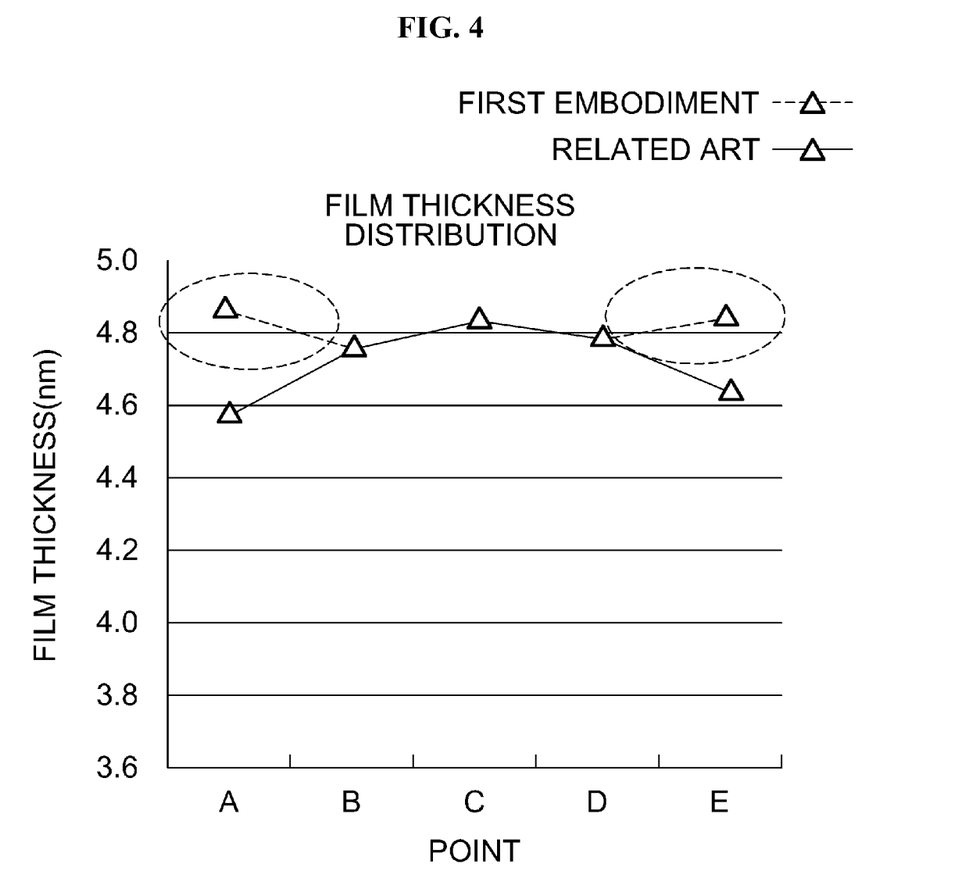
FIG. 4 is a graph comparatively illustrating a case in which an impedance value is adjusted in the substrate processing apparatus according to the first embodiment described herein and a case in which an impedance value is not adjusted.

FIG. 4 illustrates the thicknesses of the film formed by the plasma treatment of FIG. 2A, the thicknesses being measured by five locations A to E on the wafer 2. FIG. 4 comparatively illustrates the thicknesses of the film according to the first embodiment and the thicknesses of a film according to a comparative example. According to the comparative example, only one variable impedance electrode is installed in the susceptor, unlike the first embodiment. According to the first embodiment, the plurality of variable impedance electrodes (first and second impedance electrodes 15 and 16) are installed in the susceptor 8, the first and second impedance adjusting units 17 and 18 are connected to the first and second variable impedance electrodes 15 and 16, respectively, and the impedances of the first and second impedance adjusting units 17 and 18 are separately controlled.

As illustrated in FIG. 4, when one conventional variable impedance electrode is used, the thickness of the film at the central portion (point C) of the wafer is larger than the thickness of the peripheral portion (point A or E) of the film. This is because, as heat leaks through a side surface of the susceptor 8, the temperature of the peripheral portion of the wafer 2 falls.

In the first embodiment, in order to compensate for the deviation in thickness of the conventional film, the impedance of the first impedance adjusting unit 17 is adjusted to draw a large amount of plasma toward the points A and E located at the top of the variable impedance electrode 15. Specifically, the peak-to-peak voltage of the first variable impedance electrode 15 may be set to a higher voltage than the peak-to-peak voltage of the second variable impedance electrode 16. Thus, in the first embodiment, the thicknesses of the film at the points A and E of FIG. 4 may be larger than in the comparative example. As a result, the deviation in thickness between the central portion and the peripheral portion of the wafer may be reduced.

As described above, the impedances of the central portion and the peripheral portions of the variable impedance electrode may be different from each other depending on the impedance value which is intended to be set by the conventional impedance adjusting unit. Thus, the electrical potentials of the central portion and the peripheral portion of the processed surface of the wafer 2 may be different from each other, and the amount of active species drawn toward the wafer 2 may become uneven on the surface of the wafer 2. According to the first embodiment, however, the impedance of the first impedance adjusting unit 17 connected to the first variable impedance electrode 15 and the impedance of the second impedance adjusting unit 18 connected to the second variable impedance electrode 16 may be independently controlled. Thus, for a wide range of impedance values set by the first and second impedance adjusting units 17 and 18, the amount of active species drawn toward the processed surface of the wafer 2 may be uniformized on the surface of the wafer 2.

For example, when the impedance values set by the first and second impedance adjusting units 17 and 18 are relatively large, the amount of active species drawn toward the central portion of the processed surface of the wafer 2 easily becomes smaller than the amount of active species drawn toward the peripheral portion thereof. Thus, in the first embodiment, the impedance values set by the first and second impedance adjusting units 17 and 18 are independently controlled such that the impedance of the second impedance adjusting unit 18 is smaller than the impedance of the first impedance adjusting unit 17.

Thus, it is possible to remove the electrical potential difference between the first variable impedance electrode 15 and the second variable impedance electrode 16 due to the difference in impedance between the central portion and the peripheral portion of the processed surface of the wafer 2. That is, the electrical potential distribution of the processed surface of the wafer 2 may be controlled, and the electrical potential of the processed surface of the wafer 2 may be uniformized. Therefore, the amounts of active species drawn toward the central portion and the peripheral portion of the processed surface of the wafer 2 may be uniformized to improve the uniformity in thickness of the film formed on the wafer 2.

On the other hand, when the impedance values set by the first and second impedance adjusting units 17 and 18 are relatively small, the amount of active species drawn toward the central portion of the processed surface of the wafer 2 easily becomes larger than the amount of active species drawn toward the peripheral portion thereof. However, as the impedance values set by the first and second impedance adjusting units 17 and 18 are independently controlled, the amount of active species drawn toward the processed surface of the wafer 2 may be uniformized to improve the uniformity in thickness of the film formed on the wafer 2.

In the first embodiment, although the impedance values set by the first and second impedance adjusting units 17 and 18 are relatively large or small, the amount of active species drawn toward the processed surface of the wafer 2 may be uniformized on the central portion and the peripheral portion of the processed surface of the wafer 2. That is, while the amount of active species drawn toward the processed surface of the wafer 2 are uniformized on the central portion and the peripheral portion of the processed surface, the range of the impedance values of the first and second impedance adjusting units 17 and 18 may be widened.

STEP: 04 (Purge Step)

When the oxidation is ended, the supply of power to the cylindrical electrode 44 is stopped. Then, the valve 33 is closed to stop the supply of $O_2$ gas into the process chamber 3. At this time, with the valve 41 open, the process chamber 3 is continuously exhausted through the gas exhaust pipe 38 so as to discharge a residual gas within the process chamber 3. Furthermore, as the valve 36 is opened to supply $N_2$ gas as a purge gas into the process chamber 3, the discharge of the residual gas within the process chamber 3 may be promoted.

STEP: 05 (Temperature and Atmospheric Pressure Returning Step)

After the purge step STEP: 04 is completed, the opening degree of the APC 39 is adjusted to return the internal pressure of the process chamber 3 to the atmospheric pressure, while the temperature of the wafer 2 is lowered to a predetermined value which ranges from room temperature to 100° C. Specifically, while $N_2$ gas is supplied to the process chamber 3 with the valve 36 open, the opening degrees of the APC 39 and the valve 41 of the exhaust unit are controlled based on pressure information detected by a pressure sensor (not illustrated), and the internal pressure of the process chamber 3 is returned to the atmospheric pressure while the amount of power supplied to the heater 9 is controlled to lower the temperature of the wafer 2.

STEP: 06 (Substrate Unloading Step)

Then, the susceptor 8 is lowered to the transfer position of the wafer 2, and the wafer 2 is placed on the wafer lift pins 14 protruding from the surface of the susceptor 8. Finally, when the gate valve 7 is opened and the transfer mechanism (not illustrated) unloads the wafer 2 out of the process chamber 3, the substrate processing process according to the first embodiment is ended.

During the substrate processing process, the variety of conditions such as the temperature of the wafer 2, the internal pressure of the process chamber 3, the flow rates of the respective gases, power applied to the cylindrical electrode 44, and the processing time are adjusted as desired, according to the material or thickness of a film which is to be modified.

According to the first embodiment, the two variable impedance electrodes including the first and second variable impedance electrodes 15 and 16 are installed in the susceptor 8. The first and second variable impedance electrodes 15 and 16 are connected to the first and second impedance adjusting units 17 and 18, respectively, which serve as the substrate potential distribution adjusting units. Thus, since the first and second impedance adjusting units 17 and 18 connected to the first and second variable impedance electrodes 15 and 16 can independently set the impedance values, the amount of excited process gas drawn toward the wafer 2 may be uniformized, and the uniformity in thickness of the film formed on the wafer 2 may be improved.

That is, when the impedance values set by the first and second impedance adjusting units 17 and 18 are relatively large, the impedance values of the first and second impedance adjusting units 17 and 18 are independently controlled such that the impedance value of the second impedance adjusting unit 18 becomes smaller than the impedance value of the first impedance adjusting unit 17. Thus, it is possible to remove the electrical potential difference between the first and second variable impedance electrodes 15 and 16 due to the impedance difference between the central portion and the peripheral portion of the processed surface of the wafer 2. Furthermore, although the impedance values set by the first and second impedance adjusting units 17 and 18 are relatively large, the amounts of active species drawn toward the central portion and the peripheral portion of the processed surface of the wafer 2 can be uniformized.

On the other hand, when the impedance values set by the first and second impedance adjusting units 17 and 18 are relatively small, the impedance values of the first and second impedance adjusting units 17 and 18 are independently controlled such that the impedance value of the second impedance adjusting unit 18 becomes larger than the impedance value of the first impedance adjusting unit 17. Thus, it is possible to remove the electrical potential difference between the first and second variable impedance electrodes 15 and 16 due to the impedance difference between the central portion and the peripheral portion of the processed surface of the wafer 2. Furthermore, although the impedance values set by the first and second impedance adjusting units 17 and 18 are relatively small, the amounts of active species drawn toward the central portion and the peripheral portion of the processed surface of the wafer 2 can be uniformized.

Since the impedance values of the first and second variable impedance electrodes 15 and 16 can be independently adjusted to uniformize the amount of excited process gas drawn toward the wafer 2 at each process for the wafer 2, an electrical potential change on the processed surface of the wafer 2 can be reduced at each process, and the reproducibility of the process can be improved.

Thus, according to the first embodiment, although the impedance values set by the first and second impedance adjusting units 17 and 18 are relatively large or small, the amount of excited process gas drawn toward the processed surface of the wafer 2 can be uniformized, and a variety of process requests can be handled.

According to the first embodiment, the impedance values of the first and second impedance adjusting units 17 and 18 may be adjusted while the plasma treatment is performed. For example, while the plasma treatment is performed, the electrical potential of the processed surface of the wafer 2, e.g. the distribution in amount of active species drawn toward the wafer 2 can be automatically adjusted.

Figure 5A:
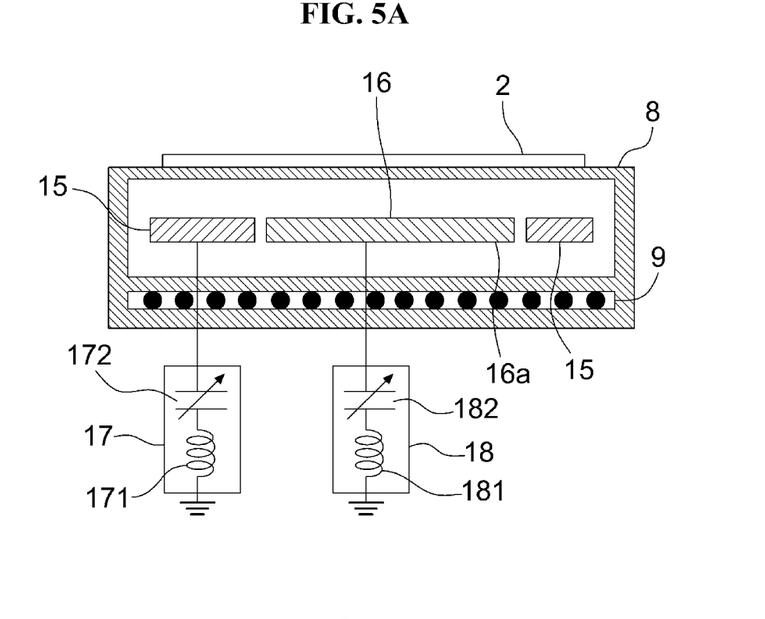
FIG. 5A is a schematic cross-sectional view of a substrate support installed in a substrate processing apparatus according to a second embodiment described herein.
Figure 5B:
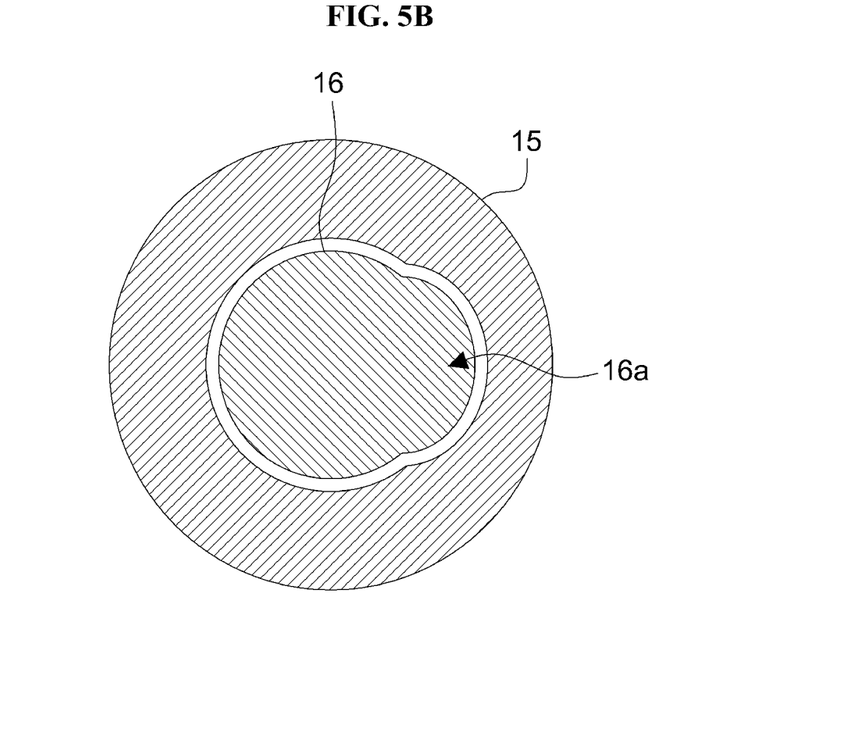
FIG. 5B is a schematic plan view of a variable impedance electrode.

Next, referring to FIGS. 5A and 5B, a second embodiment will be described. In FIGS. 5A and 5B, the same components as those of FIGS. 2A and 2B are represented by like reference numerals, and the detailed descriptions thereof are omitted herein. In FIGS. 5A and 5B, suppose that the loading/unloading port 10 of the wafer 2 is disposed at the right side with respect to the ground surface, the loading/unloading port 10 being opened/closed by the gate valve 7 (refer to FIG. 1).

In the substrate processing apparatus 1 of FIG. 1 where a plasma treatment is performed, the metallic gate valve 7 is installed in the metallic lower container 6 so as to open/close the loading/unloading port 10, and the loading/unloading port 10 and the gate valve 7 are exposed to the inside of the process chamber 3. When the plasma treatment is performed, unexpected discharge occurs at the loading/unloading port 10. Thus, plasma is drawn to where the discharge occurs. Therefore, the plasma density of a portion of the surface of the wafer 2, close to the loading/unloading port 10, is increased. As a result, the film is excessively formed at the portion. Thus, the thickness of the film formed on the surface of the wafer 2 becomes uneven.

In the second embodiment, the diameter of the second variable impedance electrode 16 in a direction facing the loading/unloading port 10, e.g. the diameter of the second variable impedance electrode 16 including an extension part 16a is larger than the diameter of the second variable impedance which does not include the extension part 16a. That is, the second variable impedance electrode 16 has a shape which is extended a predetermined distance toward the loading/unloading port 10. Considering the circumferential direction, the variable impedance electrode 15 and the extension part 16a of the variable impedance electrode 16 are arranged in areas divided along the circumferential direction.

For example, when the diameter of the second variable impedance electrode 16 which does not include the extension part 16a facing the loading/unloading port 10 of the second variable impedance electrode 16 is 75 mm, the diameter of the second variable impedance electrode 16 including the extension part 16a may be set to 100 mm.

In the second embodiment, the extension part 16a is extended in the direction facing the loading/unloading port 10 from the portion close to the loading/unloading port 10 or specifically the central portion of the processed surface of the wafer 2.

When the impedance values set by the first and second impedance adjusting units 17 and 18 are relatively small, the amount of active species drawn toward the central portion of the processed surface of the wafer 2 easily becomes larger than the amount of active species drawn toward the peripheral portion thereof. Thus, when the impedance values of the first and second impedance adjusting units 17 and 18 are not adjusted, the thickness of the film at the central portion of the processed surface of the wafer 2 becomes larger than the thickness of the film at the peripheral portion thereof, and the thickness of the film on the processed surface of the wafer 2 becomes uneven in the radial direction.

Since the thickness of the film around the loading/unloading port 10 is larger than the thickness of the film at the other portions, the thickness of the film at the peripheral portion also becomes uneven along the circumferential direction.

According to the second embodiment, since the second variable impedance electrode 16 has a shape extended toward the loading/unloading port 10, the impedance values of the central portion of the processed surface of the wafer 2 and the portions around the loading/unloading port, where the thickness of the film is large, and the impedance values of the other portions where the thickness of the film is small may be independently controlled.

Thus, as the capacitances of the variable condensers 172 and 182 are adjusted, the impedance value set by the first impedance adjusting unit 17 may be lowered to a smaller value than the impedance value set by the second impedance adjusting unit 18. Then, since the electrical potential difference between the first and second variable impedance electrodes 15 and 16 due to the impedance difference can be removed, the electrical potential distribution on the processed surface of the wafer 2 may be uniformed. Specifically, the capacitance of the variable condenser 182 may be set to a smaller value than the capacitance of the variable condenser 172.

According to the second embodiment, even when the thickness of the film is uneven in the circumferential direction of the processed surface of the wafer 2 as well as in the radial direction thereof, the impedance values of the first and second impedance adjusting units 17 and 18 can be independently controlled to improve the uniformity in thickness of the film on the processed surface of the wafer 2.

Figure 6A:
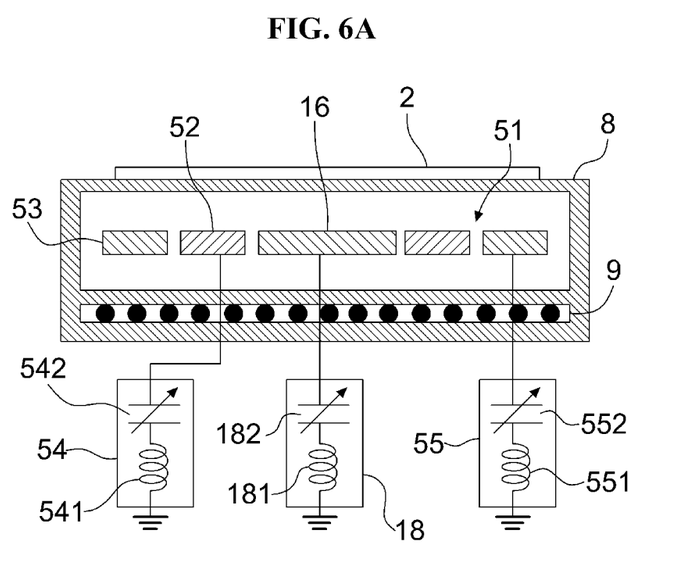
FIG. 6A is a schematic cross-sectional view of a substrate support installed in a substrate processing apparatus according to a third embodiment described herein.
Figure 6B:
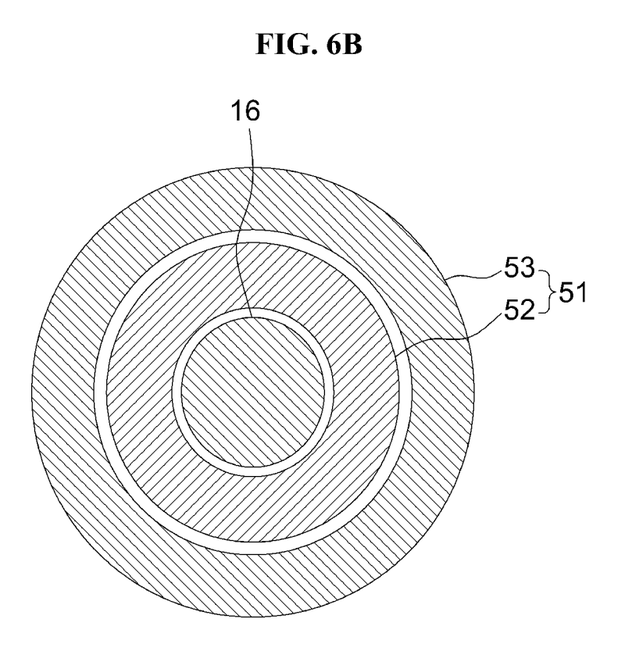
FIG. 6B is a schematic plan view of a variable impedance electrode.

Next, referring to FIGS. 6A and 6B, a third embodiment will be described. In FIGS. 6A and 6B, the same components as those of FIGS. 2A and 2B are represented by like reference numerals, and the detailed descriptions thereof are omitted herein.

Referring to FIGS. 6A and 6B, the first variable impedance electrode 51 is installed at the outer circumference of the second variable impedance electrode 16. The first variable impedance electrode 51 includes a plurality of annular variable impedance electrodes which are concentrically installed. For example, the first variable impedance electrode 51 may include a ring-shaped first inner variable impedance electrode 52 and a ring-shaped first outer variable impedance electrode 53 installed outside the first inner variable impedance electrode 52. According to the third embodiment, the variable impedance electrode unit includes three variable impedance electrodes which are concentrically arranged, e.g. the second variable impedance electrode 16, the first inner variable impedance electrode 52 and the first outer variable impedance electrode 53.

The first inner variable impedance electrode 52 and the first outer variable impedance electrode 53 are connected to a first inner impedance adjusting unit 54 and a first outer impedance adjusting unit 55, respectively, which serve as a substrate potential distribution adjusting unit.

The first inner impedance adjusting unit 54 includes a coil 541 and a variable condenser 542, and the impedance thereof is adjusted by controlling the variable condenser 542. The first outer impedance adjusting unit 55 includes a coil 551 and a variable condenser 552, and the impedance thereof is adjusted by controlling the variable condenser 552.

As the impedance values of the second impedance adjusting unit 18, the first inner impedance adjusting unit 54 and the first outer impedance adjusting unit 55 are independently controlled, the impedances of the second variable impedance electrode 16, the first inner variable impedance electrode 52 and the first outer variable impedance electrode 53 may be independently adjusted.

According to the third embodiment, when the amount of active species drawn toward a portion of the processed surface of the wafer 2, corresponding to the first inner variable impedance electrode 52, is larger than the amount of active species drawn toward a portion corresponding to the first outer variable impedance electrode 53, the impedance value set by the first inner impedance adjusting unit 54 is lowered to a smaller value than the impedance value set by the second impedance adjusting unit 18, and the impedance value set by the first outer impedance adjusting unit 55 is lowered to a smaller value than the impedance value set by the first inner impedance adjusting unit 54.

Thus, it is possible to remove the electrical potential difference among the second variable impedance electrode 16, the first inner variable impedance electrode 52 and the first outer variable impedance electrode 53 due to the impedance difference, thereby uniformizing the electrical potential distribution on the processed surface of the wafer 2 while improving the uniformity in thickness of the formed film.

Since the first variable impedance electrode 51 is constituted by the first inner variable impedance electrode 52 and the first outer variable impedance electrode 53, the impedance values can be more finely adjusted, the electrical potential distribution on the processed surface of the wafer 2 can be further uniformized, and the uniformity in thickness of the film can be improved.

According to the third embodiment, the first variable impedance electrode 51 is divided into two parts along the circumferential direction, such that the variable impedance electrode unit is divided into three parts along the circumferential direction. However, when the first variable impedance electrode 51 is divided into three or more parts, the impedance value can be more finely controlled.

Figure 7A:
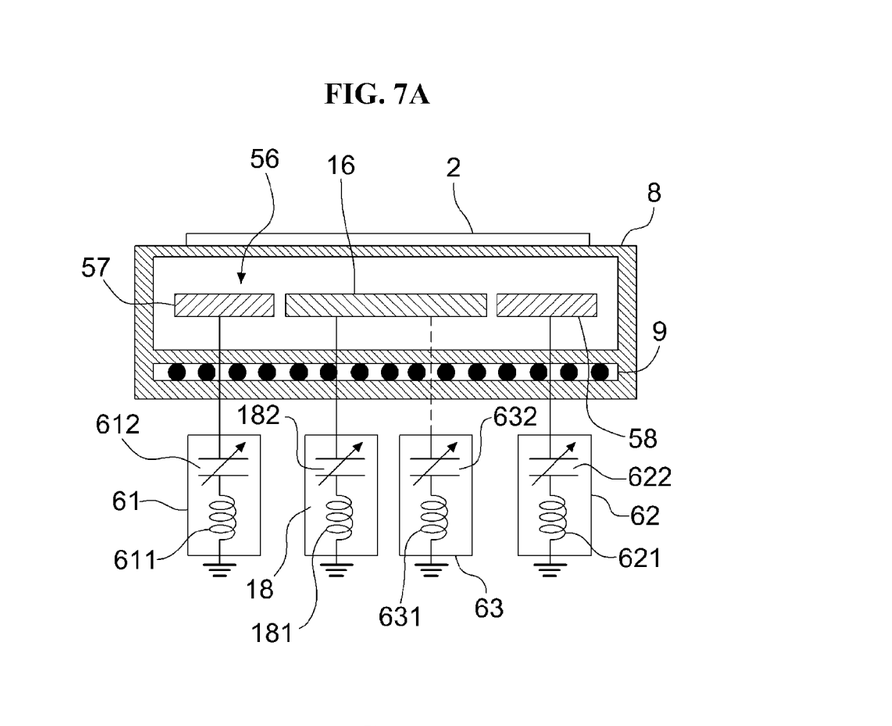
FIG. 7A is a schematic cross-sectional view of a substrate support installed in a substrate processing apparatus according to a fourth embodiment described herein.
Figure 7B:
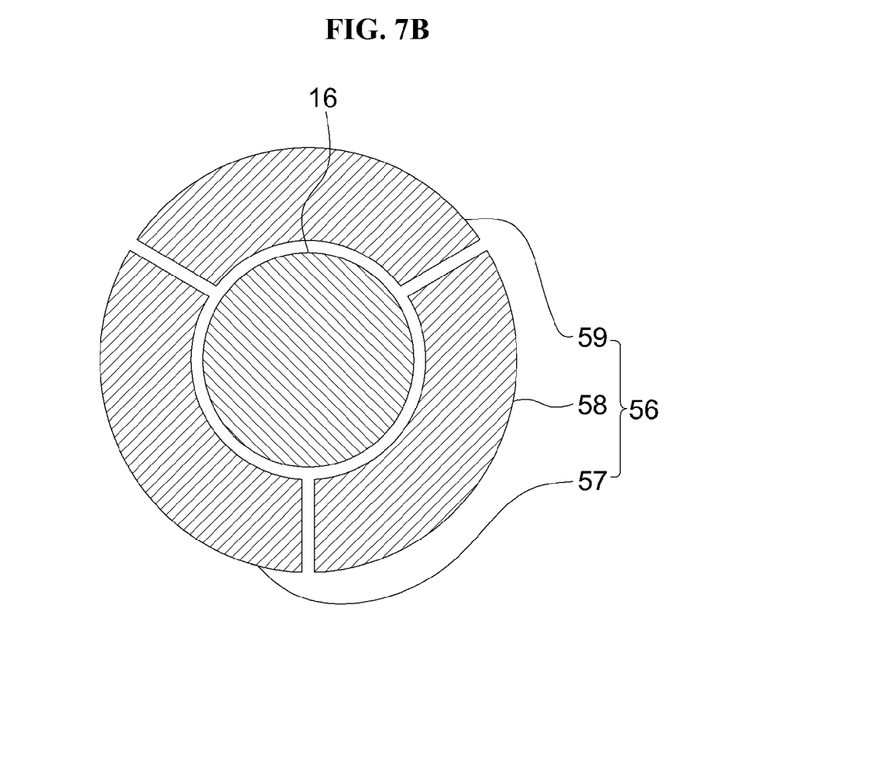
FIG. 7B is a schematic plan view of a variable impedance electrode.

Next, referring to FIGS. 7A and 7B, a fourth embodiment will be described. In FIGS. 7A and 7B, the same components as those of FIGS. 2A and 2B are represented by like reference numerals, and the detailed descriptions thereof are omitted herein. In FIGS. 7A and 7B, suppose that the loading/unloading port 10 of the wafer 2 is disposed around a second divided variable impedance electrode 58 which will be described below, the loading/unloading port 10 being opened/closed by the gate valve 7 (refer to FIG. 1).

Referring to FIGS. 7A and 7B, a first variable impedance electrode 56 is installed at the outer circumference of the second variable impedance electrode 16. The first variable impedance electrode 56 includes variable impedance electrodes divided by a predetermined angle to have a shape of an annulus sector. The first variable impedance electrode 56 includes three variable impedance electrodes divided by 120°, e.g. a first divided variable impedance electrode 57, a second divided variable impedance electrode 58 and a third divided variable impedance electrode 59.

The first divided variable impedance electrode 57, the second divided variable impedance electrode 58 and the third divided variable impedance electrode 59 are connected to a first divided impedance adjusting unit 61, a second divided impedance adjusting unit 62 and a third divided impedance adjusting unit 63, respectively, which serve as the substrate potential distribution adjusting unit.

The first divided impedance adjusting unit 61 includes a coil 611 and a variable condenser 612, and the impedance thereof is adjusted by controlling the variable condenser 612. The second divided impedance adjusting unit 62 includes a coil 621 and a variable condenser 622, and the impedance thereof is adjusted by controlling the variable condenser 622. The third divided impedance adjusting unit 63 includes a coil 631 and a variable condenser 632, and the impedance thereof is adjusted by controlling the variable condenser 632.

According to the fourth embodiment, when the amount of active species drawn toward the central portion of the processed surface of the wafer 2 is larger than the amount of active species drawn toward the peripheral portion thereof, the impedance values set by the first to third divided impedance adjusting units 61 through 63 may be lowered to values smaller than the impedance value set by the second impedance adjusting unit 18. Thus, it is possible to remove the electrical potential difference between the first and second variable impedance electrodes 56 and 16 in the radial direction due to the impedance difference, thereby uniformizing the electrical potential distribution on the processed surface of the wafer 2 in the radial direction.

Furthermore, the first variable impedance electrode 56 can be divided into the first to third divided variable impedance electrodes 57 through 59, and the impedance values thereof can be independently controlled by the first to third divided impedance adjusting units 61 through 63. Thus, when the thickness of the film on the processed surface of the wafer 2 around the loading/unloading port 10 (refer to 1) is larger than the thickness of the film at the other portions and the thickness distribution of the film becomes uneven along the circumferential direction, the impedance values set by the first and third divided impedance adjusting units 61 and 63 may be lowered to values smaller than the impedance value set by the second divided impedance adjusting unit 62 around the loading/unloading port 10.

Therefore, it is possible to remove the electrical potential difference among the first to third divided variable impedance electrodes 57 through 59 in the circumferential direction due to the impedance difference, thereby uniformizing the electrical potential distribution on the processed surface of the wafer 2 in the circumferential direction.

According to the fourth embodiment, since the electrical potential distributions of the processed surface of the wafer 2 in the radial direction and circumferential direction can be uniformized, the uniformity in thickness of the film formed on the wafer 2 can be further improved.

Moreover, in the fourth embodiment, the first variable impedance electrode 56 is divided into three parts along the radial direction. However, when the first variable impedance electrode 56 is divided into four or more parts, the impedance values can be more finely set.

The technique described herein is not limited to each of the first through fourth embodiments, but the first through fourth embodiments may be combined. For example, when the third and fourth embodiments are combined, the first variable impedance electrode may be divided along the circumferential direction into a plurality of variable impedance electrodes which are concentrically installed, and the plurality of variable impedance electrodes may be divided by a predetermined angle along the radial direction. Then, the impedance values can be more finely controlled.

In the first through fourth embodiments, the heater 9 is installed under each of the variable impedance electrodes. However, the heater 9 may be installed between the wafer 2 and the respective variable impedance electrodes.

The process wherein the wafer 2 is oxidized to form silicon oxide (SiO) is exemplified in the first through fourth embodiments. However, the technique described herein may be applied when nitrification, oxynitriding, diffusion or etching is performed on a bare wafer or a wafer including various films on the surface thereof. The oxynitriding indicates nitrification and oxidation are performed at the same time. When the nitrification is performed, a nitrogen gas supply pipe may be added to the first through fourth embodiments, and the process gas supply source 31 (refer to FIG. 1) may be changed to a nitrogen gas supply source such as ammonia gas.

When a wafer 2 including an uneven structure on the surface thereof is processed, the surface of the uneven structure of the wafer 2 may not uniformly processed. For example, the processing speed at the bottom of a concave portion of the surface of the wafer 2 may be slower than the processing speed at a sidewall of the concave portion. According to the disclosed technique, the electric field parallel to the wafer 2 may be set to a larger value than the electric field perpendicular to the wafer 2 by the substrate potential distribution unit, thereby improving the processing speed at the sidewall of the concave portion. Thus, since the surface of the concave portion can be uniformly processed, the surface of the uneven structure may be processed to have a satisfactory coverage characteristic.

The process using an MMT apparatus as the substrate processing apparatus 1 is exemplified in the first through the fourth embodiments. However, the technique described herein may use an ICP (Inductively Coupled Plasma) apparatus or ECR (Electron Cyclotron Resonance) apparatus.

Figure 8:
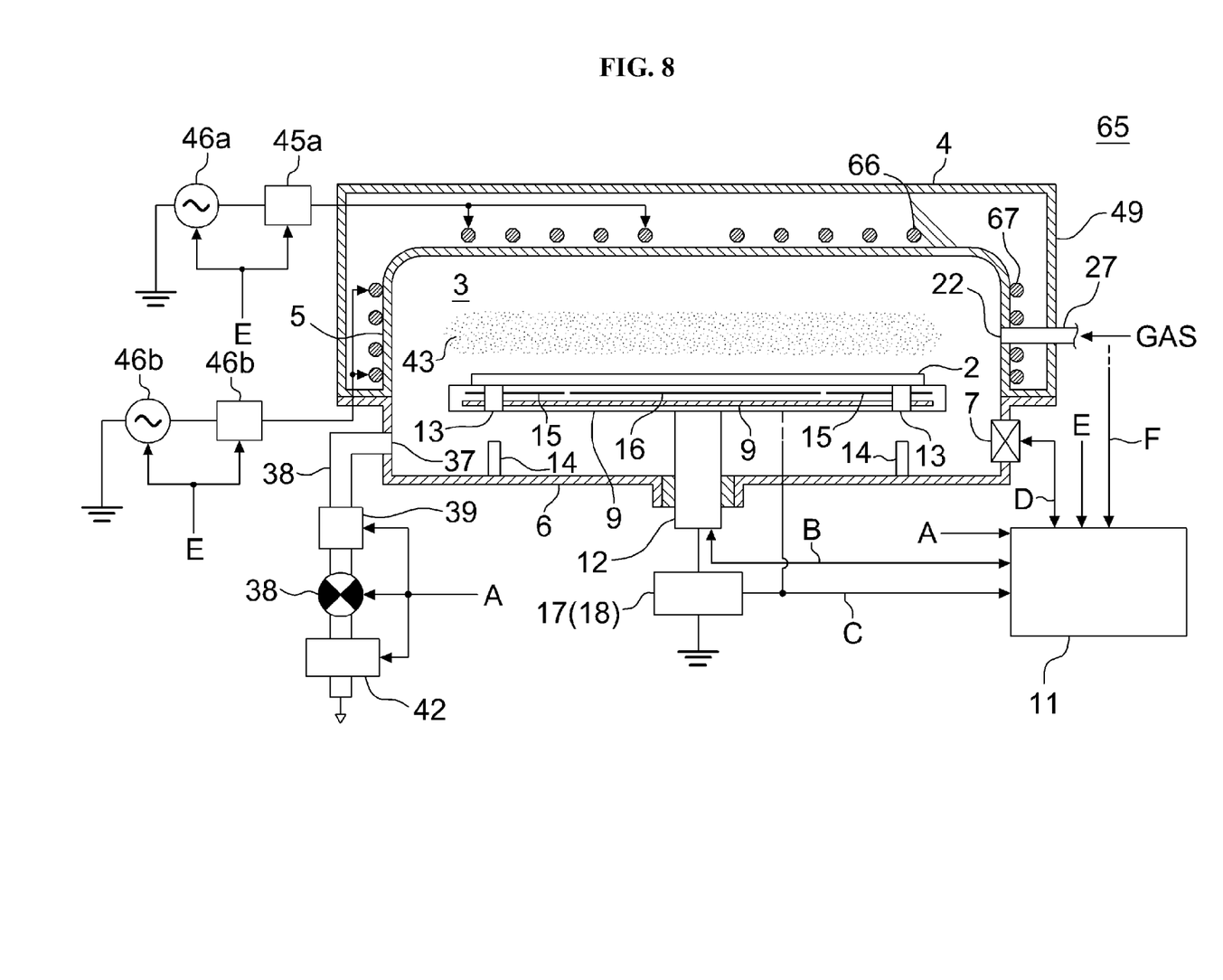
FIG. 8 is a schematic cross-sectional view of a substrate processing apparatus according to a fifth embodiment described herein.

FIG. 8 illustrates an ICP-type plasma processing apparatus 65 which is a substrate processing apparatus according to a fifth embodiment. In FIG. 8, the same components as those of FIG. 1 are represented by like reference numerals, and the detailed descriptions thereof are omitted herein. In FIG. 8, the gas supply unit is omitted.

The ICP-type plasma processing apparatus 65 includes dielectric coils 66 and 67 which generate plasma by applying high-frequency power. The dielectric coil 66 is installed outside the ceiling of the upper container 5, and the dielectric coil 67 is installed on an upper portion of an outer wall of the upper container 5. In the ICP-type plasma processing apparatus 65, at least O2 gas serving as a process gas is supplied into the process chamber 3 through the gas introduction unit 22 from the gas supply pipe 27. As the high-frequency power is applied to the dielectric coils 66 and 67 serving as plasma generating units while the process gas is supplied, an electric field may be generated by electromagnetic induction, and the process gas may be excited by the electric field, thereby generating active species.

Figure 9:
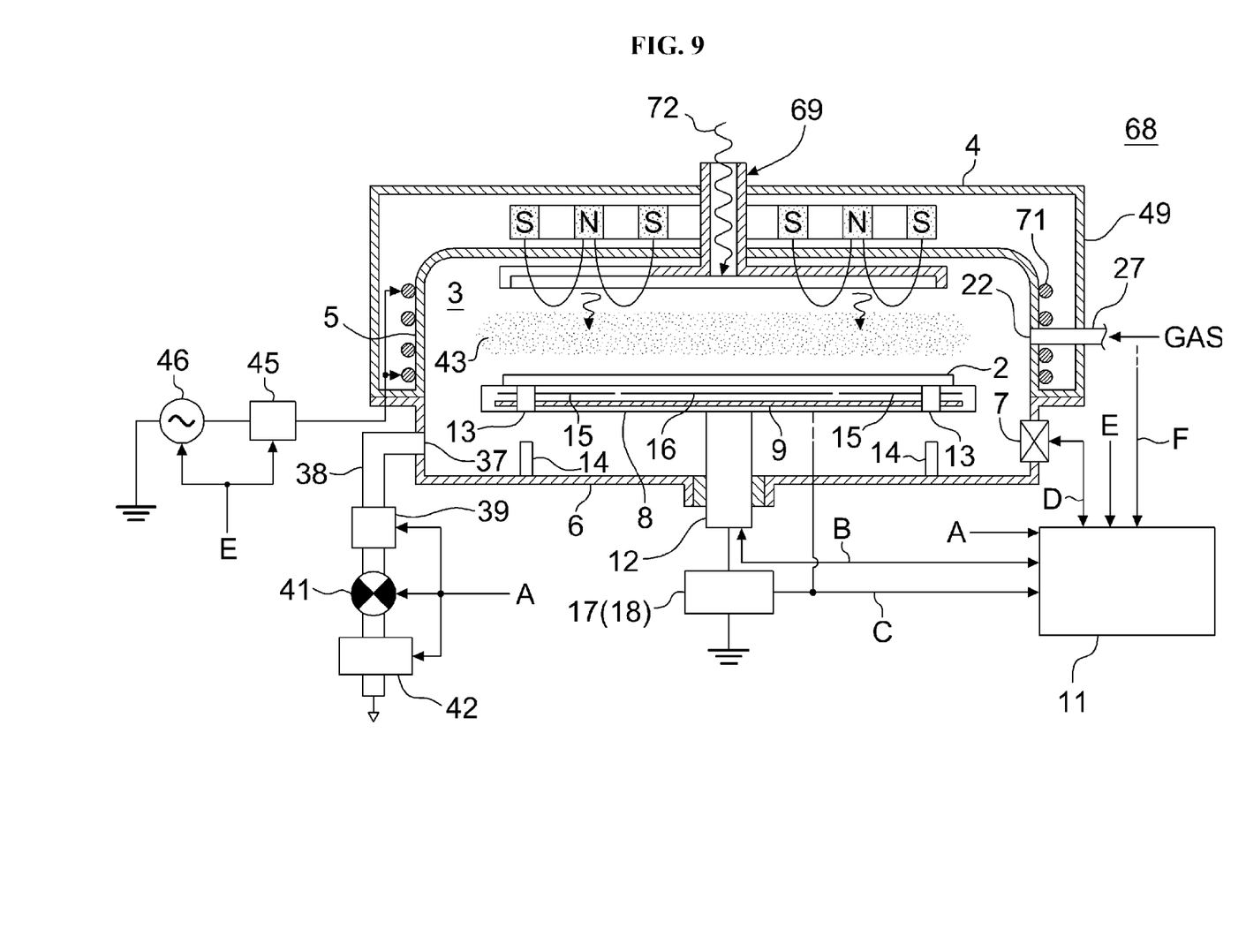
FIG. 9 is a schematic cross-sectional view of a substrate processing apparatus according to a sixth embodiment described herein.

FIG. 9 illustrates an ECR-type plasma processing apparatus 68 which is a substrate processing apparatus according to a sixth embodiment. In FIG. 9, the same components as those of FIG. 1 are represented by like reference numerals, and the detailed descriptions thereof are omitted herein. In FIG. 9, the gas supply unit is omitted.

The ECR-type plasma processing apparatus 68 includes a microwave introduction pipe 69 and a dielectric coil 71 which serve as a plasma generating unit for generating plasma by supplying a microwave. The microwave introduction pipe 69 is installed outside the ceiling of the process container 4, and the dielectric coil 71 is installed on an upper portion of an outer wall of the process container 4. In the ECR-type plasma processing apparatus 68, at least $O_2$ gas serving as a process gas is supplied into the process chamber 3 through the gas introduction unit 22 from the gas supply pipe 27. While the process gas is supplied, a microwave 72 is introduced into the microwave introduction pipe 69 serving as the plasma generating unit, and then emitted into the process chamber 3. As the process gas is excited by the microwave 72 and the high-frequency power from the dielectric coil 71, active species may be generated.

As illustrated in FIGS. 8 and 9, the first and second variable impedance electrodes 15 and 16 are installed in the susceptor 8, and the impedance adjusting units 17 and 18 capable of setting impedance values are connected to the first and second variable impedance electrodes 15 and 16, respectively. Thus, the embodiments described with reference to FIGS. 8 and 9 have the same effect as the first embodiment.

Similarly, as the first variable impedance electrode 15 extended toward the loading/unloading port 10 is divided along the radial direction or circumferential direction, the embodiments described with reference to FIGS. 8 and 9 have the same effect as the second through fourth embodiments.

Supplementary Notes

The technique includes the following embodiments.

Supplementary Note 1

According to another embodiment of the technique, a substrate support installed in a process chamber where a substrate is processed includes: an electrode connected to an impedance adjusting unit which adjusts an impedance value at a substrate loading/unloading port such that the impedance value is higher than an impedance value at the opposite side of the substrate loading/unloading port; and a cover configured to cover the electrode, and having a substrate placing part formed on the surface thereof.

According to the technique described herein, the uniformity in thickness of the film formed on the substrate can be improved.

What is claimed is:

1. A substrate processing apparatus comprising:
   a plasma generating unit configured to excite a process gas into plasma state;
   a process chamber where a substrate is processed using the process gas excited in plasma state;
   a loading port installed at a sidewall of the process chamber, wherein the substrate is passed through the loading port when the substrate is loaded into the process chamber;
   a substrate support supporting the substrate in the process chamber;
   an electrode unit installed in the substrate support and including a plurality of divided electrodes;
   a plurality of impedance adjusting units configured to adjust impedances of the plurality of divided electrodes, wherein each of the plurality of impedance units is electrically connected to each of the plurality of divided electrodes; and
   a control unit configured to control the impedances of the plurality of impedance adjusting units so as to adjust the electrical potentials of the respective electrodes of the electrode unit, wherein the control unit controls the plurality of impedance adjusting units such that an electrical potential of an electrode positioned in a direction facing the loading port as viewed from the center of the electrode unit among the plurality of divided electrodes is higher than electrical potentials of the other electrodes among the plurality of divided electrodes such that an amount of active species of the excited process gas drawn toward the substrate is uniform throughout the surface of the substrate.

2. The substrate processing apparatus of claim 1, wherein at least two of the plurality of electrodes are divided along a circumferential direction thereof.

3. The substrate processing apparatus of claim 1, wherein the plurality of electrodes comprises an inner electrode having a circular shape and disposed at a center and a plurality of outer electrodes surrounding the inner electrode.

4. The substrate processing apparatus of claim 3, wherein at least two of the plurality of outer electrodes are divided along a circumferential direction thereof.

5. A substrate processing apparatus comprising:
   a plasma generating unit configured to excite a process gas into plasma state;
   a process chamber where a substrate is processed using the process gas excited in plasma state;
   a loading port installed at a sidewall of the process chamber, wherein the substrate is passed through the loading port when the substrate is loaded into the process chamber;
   a substrate support supporting the substrate in the process chamber;
   an electrode unit installed in the substrate support and including a plurality of divided electrodes; and
   an impedance adjusting unit electrically connected to each of the plurality of electrodes and configured to adjust an impedance thereof;
   wherein an electrode positioned in the center of the electrode unit among the plurality of electrodes comprises an extension part extending horizontally toward the loading port.

6. The substrate processing apparatus of claim 5, wherein the control unit is further configured to control the impedance adjusting unit to adjust the impedance thereof such that an impedance applied to the electrode positioned in the center of the electrode unit is higher than an impedance applied to the plurality of electrodes other than the electrode positioned in the center of the electrode unit.

7. A method of manufacturing a semiconductor device, comprising:
   (a) loading a substrate into a process chamber of a substrate processing apparatus through a loading port;
   (b) placing the substrate on a substrate support having an electrode unit comprising a plurality of divided electrodes after performing (a);
   (c) electrically connecting each of a plurality of impedance adjusting units configured to adjust impedances of the plurality of divided electrodes to each of the plurality of divided electrodes;
   (d) configuring a control unit to control the impedances of the plurality of impedance adjusting units so as to adjust the electrical potentials of the respective electrodes of the electrode unit;
   (e) adjusting, via the control unit, an electrical potential applied to an electrode positioned in a direction facing the loading port as viewed from the center of the electrode unit among the plurality of divided electrodes to be higher than electrical potentials applied to the other electrodes among the plurality of divided electrodes state such that an amount of active species of an excited process gas drawn toward the substrate is uniform throughout the surface of the substrate; and
   (f) processing the substrate placed on the substrate support using the excited process gas in plasma state.

8. The method of claim 7, wherein at least two of the plurality of electrodes are divided along a circumferential direction thereof.

9. The method of claim 7, wherein the plurality of electrodes comprises an inner electrode having a circular shape and disposed at a center and a plurality of outer electrodes surrounding the inner electrode.

10. The method of claim 9, wherein at least two of the plurality of outer electrodes are divided along a circumferential direction thereof.

* * * * *